(12) United States Patent
Soga

(10) Patent No.: US 6,567,611 B1
(45) Date of Patent: May 20, 2003

(54) ELECTRONIC IMAGE RECORDING APPARATUS

(75) Inventor: Takashi Soga, Asaka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/245,407

(22) Filed: Feb. 5, 1999

(30) Foreign Application Priority Data

Feb. 6, 1998 (JP) ............................................ 10-025570

(51) Int. Cl.[7] ................................................ H04N 5/91
(52) U.S. Cl. ...................... 386/107; 386/118; 348/374; 358/909.1
(58) Field of Search ........................... 386/46, 107, 117, 386/118, 109, 112; 358/906, 909.1; 348/373, 374, 231.99

(56) References Cited

U.S. PATENT DOCUMENTS 6,147,708 A * 11/2000 Suzuki et al. ............. 358/906.1
6,433,825 B1 * 8/2002 Cama et al. ................ 348/373

FOREIGN PATENT DOCUMENTS

| JP | 1-220980 | 9/1989 | .......... H04N/5/225 |
| JP | 407282217 A | * 10/1995 | |
| JP | 409098320 A | * 4/1997 | |
| JP | 9-148710 | 6/1997 | ............ H05K/1/18 |

* cited by examiner

Primary Examiner—Huy Nguyen
(74) Attorney, Agent, or Firm—Sughrue Mion, PLLC

(57) ABSTRACT

The arrangement of electric circuit boards and an optical unit including a CCD is optimized to minimize the volume of the electronic camera, and to shield the circuit boards from one another by utilizing the essential components of the camera themselves. A memory card chamber and an LCD unit are separately shielded with conductive walls. An analog circuit board, a power source circuit board, the memory card chamber, a digital circuit board and the LCD unit are arranged in that order, parallel to one another, and perpendicular to the optical axis of the optical unit. Thus, the digital circuit board that is the worst source of noises can be shielded by the memory card chamber and the LCD unit without any special shielding members, and a signal wire between the CCD and the analog circuit can be perpendicular to the circuit boards. A metal casing of the camera connects to the walls of the memory card chamber and the LCD unit in order to reinforce the ground.

4 Claims, 3 Drawing Sheets

F I G. 1
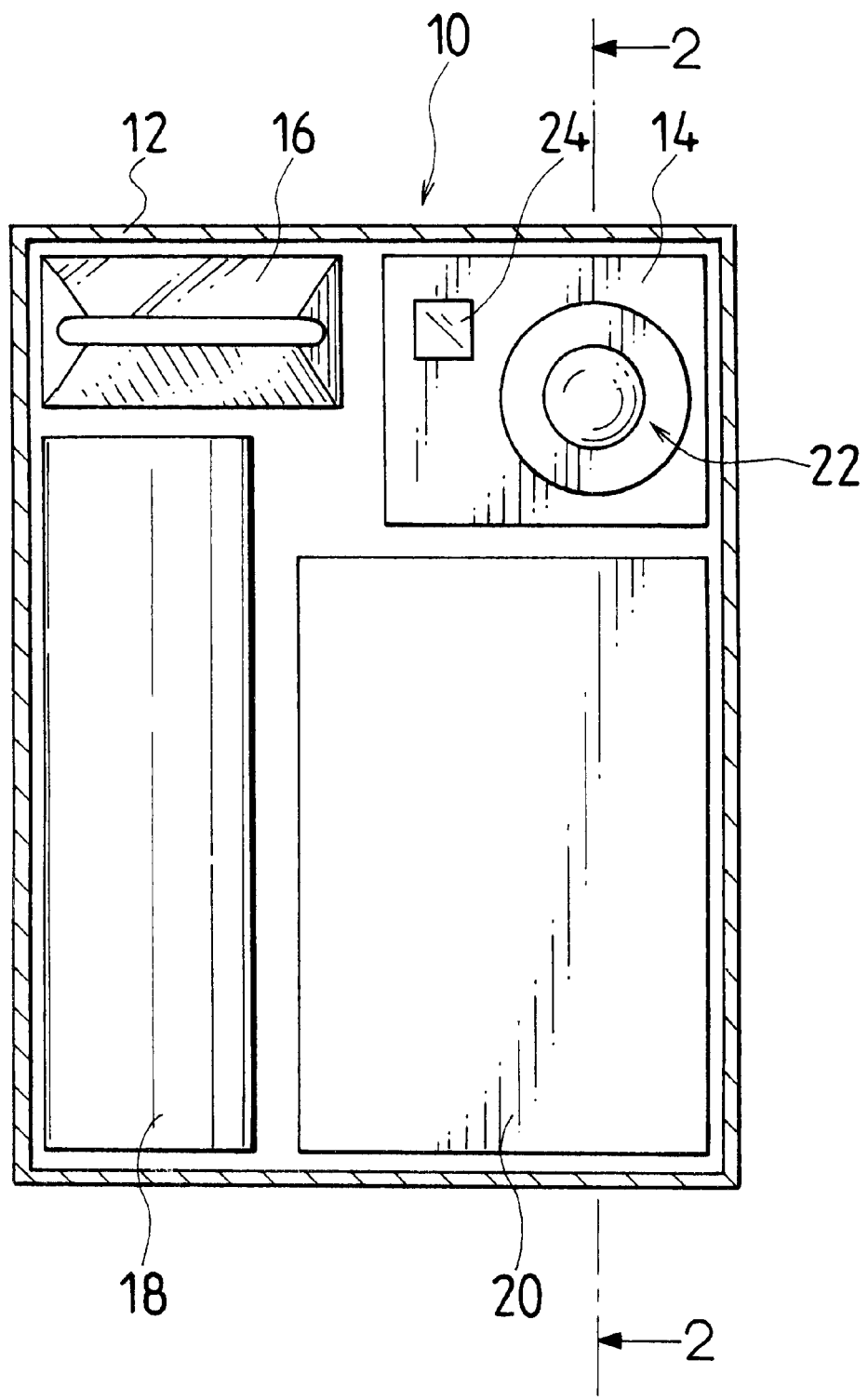

ELECTRONIC IMAGE RECORDING APPARATUS

BACKGROUND OF THE INVENTION

1. Field of the Invention

The present invention relates to an electronic image recording apparatus, and more particularly to an arrangement of components of an image recording apparatus such as an electronic still camera and a digital video camera, which converts a captured image into a digital signal and records the digital signal onto a recording medium.

2. Description of Related Art

The circuits of the electronic still camera are generally classified into an analog circuit, a digital circuit and a power source circuit. The relatively large parts connected to the electronic circuits are a taking lens, a finder, a recording medium connector and a liquid crystal display (LCD) monitor.

Japanese Patent Provisional Publication Nos. 9-148710 and 1-220980 disclose the arrangement of the components in the electronic still camera.

Japanese Patent Provisional Publication No. 9-148710 discloses an arrangement of the analog circuit and the digital circuit that are mounted on one circuit board, and an arrangement of the circuit board and the recording medium connector. Although Japanese Patent Provisional Publication No. 9-148710 mentions providing a plate that shields the analog circuit, it fails to mention the arrangement of a plurality of circuit boards. According to Japanese Patent Provisional Publication No. 9-148710, the shielding plate must be provided as a special member and this is not desirable for reducing the number of parts and the size of the apparatus.

According to Japanese Patent Provisional Publication No. 1-220980, a memory card as the recording medium is arranged between the taking lens and a charge coupled device (CCD) as an imaging device, and a light passage hole is formed in the memory card on an area corresponding to the optical path between the taking lens and the CCD; however, it fails to disclose the shield between the circuit boards for reducing the effects of noises.

Recently, compact and lightweight electronic still cameras have been developed, which have high image quality, and thus, there is a desire to reduce the effects of noises and the size of the apparatus.

SUMMARY OF THE INVENTION

The present invention has been developed in view of the above-described circumstances, and has as its object the provision of an electronic image recording apparatus, which is constructed in the smallest size possible in an optimum arrangement of circuit boards and members such as a taking lens, and which achieves shielding (reducing the effects of electric and magnetic fields) between the circuit boards by utilizing components of the apparatus themselves.

To achieve the above-mentioned object, the present invention is directed to an electronic image recording apparatus comprising: an optical unit comprising a taking lens and an imaging device for converting a subject image formed by the taking lens into an analog image signal representing the subject image; a first circuit board on which an analog/digital converter is mounted, the analog/digital converter converting the analog image signal sent from the imaging device into a digital image signal; a second circuit board on which a compression/decompression circuit is mounted, the compression/decompression circuit compressing the digital image signal sent from the analog/digital converter to record onto a recording medium and decompressing a compressed digital image signal read from the recording medium; a recording medium chamber into which the recording medium is detachably inserted, the compressed digital image signal sent from the compression/decompression circuit being recorded onto the inserted recording medium, the compressed digital image signal recorded in the inserted recording medium being read from the inserted recording medium, the recording medium chamber being shielded with a wall having conductivity of electricity; and an image display unit comprising a display for displaying the image captured by the imaging device, the image display unit being shielded with a wall having conductivity of electricity; and wherein the first circuit board, the recording medium chamber, the second circuit board and the image display unit are arranged in that order and parallel to one another such that the recording medium chamber and the image display unit themselves serve as shields.

According to the present invention, the recording medium chamber and the image display unit of the electronic image recording apparatus have the shielding structure, and these two components are arranged appropriately with respect to the first and second circuit boards, so that the recording medium chamber and the image display unit can be utilized as shielding plates between the circuit boards.

This eliminates the necessity for special shielding plates and realizes the compact electronic image recording apparatus of high image quality. Moreover, the electronic image recording apparatus is hardly effected by noises.

In particular, since the optical unit including the imaging device is easily effected by noises, the electronic circuit members such as the first and second circuit boards are preferably perpendicular to the optical axis of the optical unit. Generally speaking, if a signal wire is parallel to a noise source, a signal on the wire tends to be affected by the noises. If the optical unit is perpendicular to the circuit boards, the signal wire transmitting the output signal from the imaging device is not parallel to the circuit boards, thereby reducing the effects of the noises. In this arrangement, since the components are arranged in the minimum size, the apparatus is compact.

A casing of the apparatus preferably has conductivity of electricity, by being made of metal for example, and it is possible to reduce the radiation of noises to the outside. The conductive casing and the inner shielding members, which are the recording medium chamber and the image display unit themselves, are connected to one another in order to reinforce the ground. This improves the shielding effects and the noise reducing effects.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 1 is a front view illustrating the interior structure of an electronic still camera according to an embodiment of the present invention;

DETAILED DESCRIPTION OF THE PREFERRED EMBODIMENT

This invention will be described in further detail by way of example with reference to the accompanying drawings.

Figure 2:
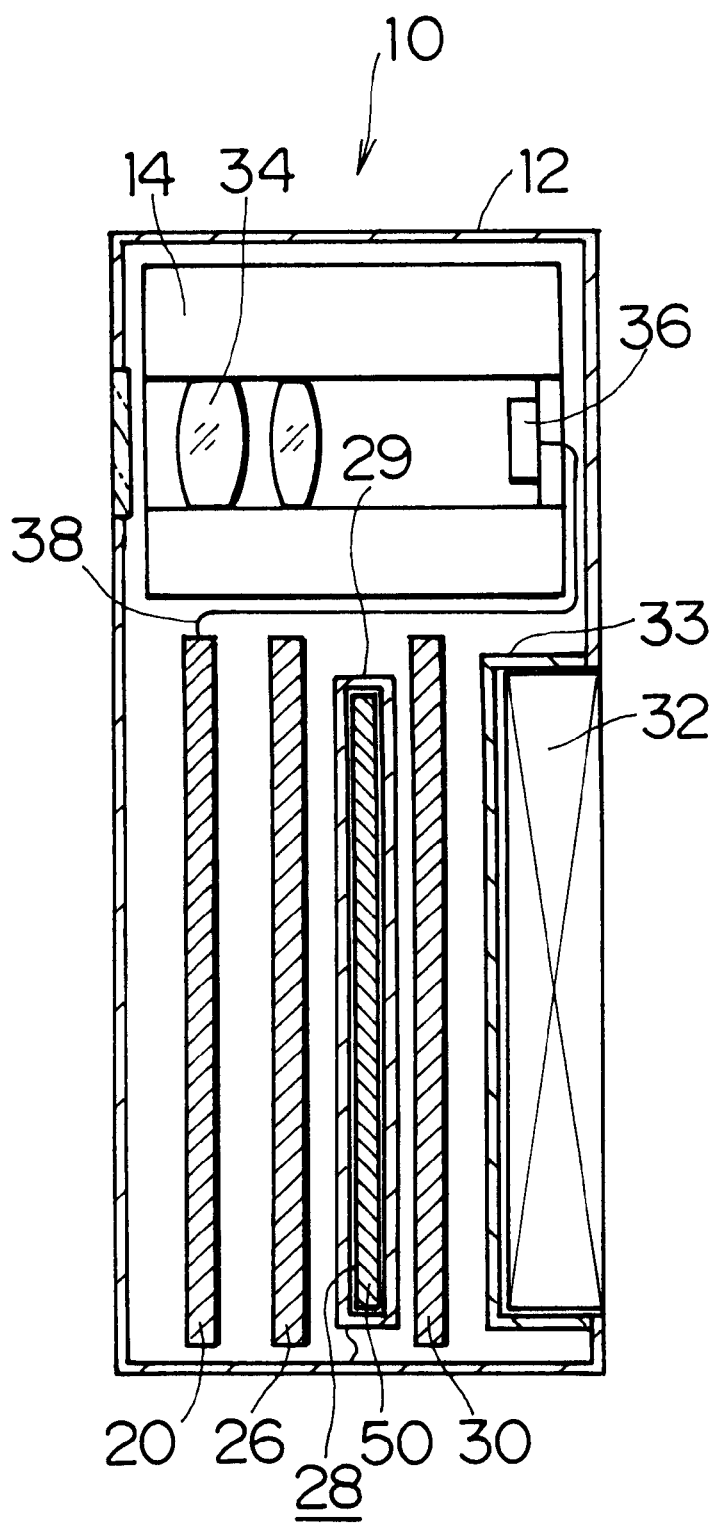
FIG. 2 is a sectional view of the electronic still camera taken along a line 2—2 in FIG. 1.

FIGS. 1 and 2 show an embodiment wherein the present invention is applied to an electronic still camera. The electronic still camera 10 is constructed in such a way that an optical unit 14, a flash device 16, a battery 18, an analog circuit board 20 and other circuit boards are arranged in a casing 12. The optical unit 14 includes an image-capturing optical system 22 and an optical finder 24, and it is arranged at the upper right corner of the front of the camera 10 in FIG. 1. The flash device 16 is next to the optical unit 14 on the left.

The battery 18 is columnar, and it is arranged vertically below the flash device 16. The substantially quadrilateral analog circuit board 20 is arranged below the optical unit 14 and at the right side of the battery 18, and is perpendicular to the optical axis of a taking lens 34 (see FIG. 2) of the image-capturing optical system 22.

As shown in FIG. 2, the analog circuit board 20, a power source circuit board 26, a recording medium chamber or a memory card chamber 28, a digital circuit board 30, and an image display unit or an LCD monitor unit 32 are arranged in that order and parallel to one another.

The optical unit 14 comprises the taking lens 34 and a CCD 36 arranged behind the taking lens 34, and is the most sensitive to noises (external electric and magnetic fields) among the components of the electronic still camera 10. The optical axis of the optical unit 14 is perpendicular to the circuit boards so that a signal wire 38 of the CCD 36 cannot be parallel to the circuit boards such as the digital circuit board 30 that is the worst source of noises. The CCD 36 is connected to the analog circuit board 20, which is arranged at the forefront of the camera 10, through the signal wire 38. Thus, the signal wire 38, which transmits an analog image signal output from the CCD 36, is perpendicular to the circuit boards such as the digital circuit board 30.

An analog signal processing part 40 (see FIG. 3), which performs an analog processing for the analog image signal sent from the CCD 36, and an analog/digital (A/D) converter 42 (see FIG. 3), which converts the analog image signal into an digital image signal, are mounted on the analog circuit board 20.

An analog power source circuit providing the power for the analog circuits is mounted on one side of the power source circuit board 26, which faces the front side of the camera 10, and a digital power source circuit providing the power for the digital circuits is mounted on the other side of the power source circuit board 26. Specifically, one side of the power source circuit board 26 on which parts as great noise sources such as the digital power source circuit and a transformer are mounted faces the memory card chamber 28 (the right side in FIG. 2), and the other side on which parts that will not be noise sources such as the analog power source circuit faces the analog circuit board 20 (the left side in FIG. 2).

A memory card 50, on which the image data is recorded, is detachably inserted into the memory card chamber 28. An electricity-conductive wall or a shield 29, which is made of metal for example, is placed around the memory card chamber 28.

A digital signal processing part 44 (see FIG. 3), which includes at least a compression/decompression circuit and processes the digital image signal appropriately, is mounted on the digital circuit board 30. The compression/decompression circuit compresses the digital image signal sent from the analog/digital converter 42 to record onto the memory card 50, and decompresses a compressed digital image signal read from the memory card 50.

The LCD unit 32 including an LCD 48 (see FIG. 3), to which a D/A output signal is sent from the digital circuit board 30, is arranged next to the digital circuit board 30 on the right in FIG. 2, so that a screen of the LCD 48 can be exposed from the back of the camera 10. The image captured by the image-capturing optical system 22 is displayed on the screen of the LCD unit 32. An electricity-conductive wall or a shield 33, which is made of metal for example, is placed around the LCD unit 32 and is attached to the casing 12 of the camera 10.

Figure 3:
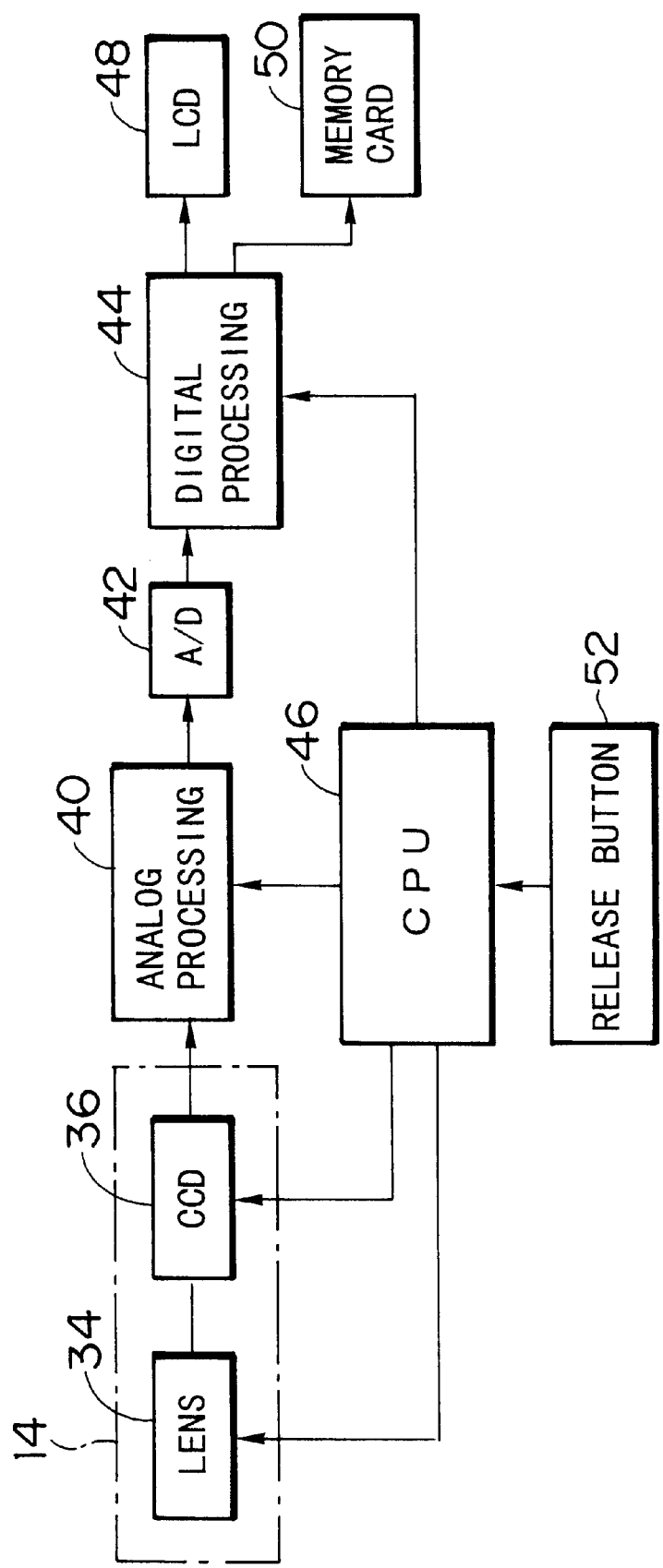
FIG. 3 is a block diagram illustrating the structure of the electronic still camera.

FIG. 3 is a block diagram illustrating the structure of the electronic still camera 10. The electronic still camera 10 comprises the taking lens 34, the CCD 36, the analog signal processing part 40, the A/D converter 42, the digital signal processing part 44, a central processing unit (CPU) 46, the LCD 48, the memory card 50 and a release button 52.

For example, a zoom lens composed of multiple lenses is used for the taking lens 34, and a driving force of a lens driving part including a motor (not illustrated) moves the zoom lens in telephoto or wide directions. A later-described AF function is capable of moving a focus lens system.

A subject image is formed on a light receiving surface of the CCD 36 through the taking lens 34, and the subject image is photoelectrically converted and sequentially read as analog image signals. A CDS circuit of the analog signal processing part 40 sample-holds the image signals sent from the CCD 36 for each pixel. Then, gain control amplifiers amplify the image signals, and the A/D converter 42 converts the analog image signals into dot-sequential R, G and B digital signals. The digital signals are sent to the digital signal processing part 44. A timing generator (not illustrated), which is controlled by the CPU 46, outputs timing signals to the CCD 36, the CDS circuit and the digital signal processing part 44. The timing signals synchronize the circuits.

Although not illustrated in detail, the digital signal processing circuit 44 includes a variety of digital processing circuits such as a brightness signal generating circuit, a color difference signal generating circuit, a photometry value calculating circuit and the compression/decompression circuit. The digital signal processing part 44 processes the digital image signal sent from the A/D converter 42, and the processed signal is sent as a monitor output signal to the LCD 48. If the LCD 48 accepts only analog signals, a D/A converter may be provided between the digital signal processing part 44 and the LCD 48 so that the digital image signal can be converted into the analog signal.

Thus, the image captured by the CCD 36 is shown on the LCD 48. The LCD 48 is capable of showing not only a still image, which is recorded in response to the pressing of the release button 52, but also moving images or intermittent images captured before the recording.

The digital image signal that is output from the digital signal processing part 44 is compressed in a predetermined format such as JPEG, and the compressed image signal is recorded in a recording medium such as the detachable memory card 50 in response to the input of a recording start signal. In this embodiment, the memory card 50 is used as the recording medium, but a flash memory built-in the camera, a detachable smart medium, an optical magnetic disk, an IC card, etc. may also be used as the recording medium.

In this embodiment, the recording start signal is generated in response to the pressing of the release button 52. The recording start signal may also be input from the outside of the camera through the communication with outside equipment, etc.

The CPU 46 unites and controls the circuits of the camera 10. The CPU 46 drives the taking lens 34 to perform the focusing, etc. in accordance with the input of a signal from the release button 52. The CPU 46 also controls the analog signal processing part 40 and the digital signal processing part 44.

For example, the CPU 46 calculates an exposure, a focusing position, etc. in accordance with a predetermined algorithm, and it controls the automatic exposure control, the auto focusing, the auto flash, the auto white balance, etc. Specifically, the CPU 46 controls an electronic shutter value of the CCD 36 in accordance the exposure value calculated from the image signal to thereby set the exposure. The CPU 46 also controls the gain control amplifiers in accordance with the calculated RB gain to thereby set the white balance.

The CPU 46 calculates a focus evaluation value representing the sharpness of the subject image from the image signal, and calculates the focusing position in accordance with the focus evaluation value. Then, the CPU 46 controls the focusing system of the taking lens 34 in accordance with the calculated focusing position to thereby set the focusing position. A well-known focusing means such as an AF sensor may be used as the auto focusing means.

In addition, the CPU 46 controls the zoom optical system through the lens driving part in accordance with the focal length of the taking lens 34 set by the cameraman through a zoom control means, to thereby set the focal length of the taking lens 34.

A description will be given of the operation of the electronic still camera 10, which is constructed in the above-mentioned manner.

As has already been described with reference to FIGS. 1 and 2, the optical unit 14 and the flash device 16 are arranged side by side in the upper section of the camera 10, and the battery 18 and the electronic circuit members such as the analog circuit board 20 are arranged vertically below the optical unit 14 and the flash device 16. Consequently, the components of the electronic still camera 10 as the whole is substantially rectangular-parallelepiped and compact. The components (the optical unit 14, the flash device 16, the battery 18, and the members relating to the electronic circuits such as the analog circuit board 20) are efficiently arranged in the rectangular-parallelepiped casing 12. Thus, the camera 10 can be compact.

Generally speaking, if the signal wire is parallel to the circuits as the noise sources, the signal on the wire tends to be affected by noises. For this reason, the optical unit 14, which is sensitive to noises, is arranged perpendicularly to the circuit boards as the noise sources, and the signal wire 38, which transmits the output signal of the CCD 36, is perpendicular to the circuit boards. Consequently, the output signal of the CCD 36 is hardly affected by the noises from the electronic circuits.

In particular, the analog circuit board 20 is arranged at the forefront of the camera 10. One side of the analog circuit board 20 (the left side in FIG. 2) is adjacent to the casing 12 at the front of the camera 10, and the other side (the right side in FIG. 2) is adjacent to the analog power source circuit on one side (the left side in FIG. 2) of the power source circuit board 26, which generates a relatively small amount of noises. Such the arrangement reduces the effects of the noises from other circuits to the analog circuits on the analog circuit board 26 as much as possible.

The digital power source circuit on the other side (the right side in FIG. 2) of the power source circuit board 26 is adjacent to the memory card chamber 28, which is provided with the shield 29. Thus, the digital power source circuit is shielded by the shield 29.

The digital circuit board 30, which generates the largest amount of noises, is shielded in such a manner that it is arranged between the memory card connector 28 and the LCD unit 32, which are provided with the shields 29 & 33, respectively. Thus, without providing any special shielding members, the memory card connector 28 and the LCD unit 32, which are essential components of the camera, are utilized as the shields, and the arrangement of the circuit boards achieves the shielding effect.

In this embodiment, the components of the camera are arranged in the minimum size, and the camera is hardly effected by the noise.

Moreover, the casing 12 preferably has conductivity of electricity, by being made of metal for example, to reduce the radiation of noises to the outside. Furthermore, the conductive casing 12 is preferably connected to the inner shield members, which are the shield 29 of the memory card connector 28 and the shield 33 of the LCD unit 32, through conductive members such as solders and wires in order to reinforce the ground, thereby improving the shielding effects and the noise reducing effects.

In FIGS. 1 and 2, the analog circuit board 20 and the power source circuit board 26 are independent of one another, but they may also be integrated into one substrate.

In this embodiment, the present invention is applied to the electronic still camera, but the present invention may also be applied to an image recording apparatus that records captured motion-picture data onto a recording medium such as a memory card.

As set forth hereinabove, according to the electronic image recording apparatus of the present invention, the memory card chamber and the LCD unit, which are the essential components of the camera and have the shields, are also utilized as the shield plates, which reduce the effects of electric and magnetic fields between the analog circuit board and the digital circuit board. This realizes the compact electronic image recording apparatus, which enables the shielding between the circuit boards and reduces the effects of the noises without providing special shielding plates.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. An electronic image recording apparatus comprising:
an optical unit comprising a taking lens and an imaging device for converting a subject image formed by the taking lens into an analog image signal representing the subject image;
a first circuit board on which an analog/digital converter is mounted, the analog/digital converter converting the analog image signal sent from the imaging device into a digital image signal;
a second circuit board on which a compression/decompression circuit is mounted, the compression/decompression circuit compressing the digital image signal sent from the analog/digital converter to record onto a recording medium and decompressing a compressed digital image signal read from the recording medium;

a recording medium chamber into which the recording medium is detachably inserted, the compressed digital image signal sent from the compression/decompression circuit being recorded onto the inserted recording medium, the compressed digital image signal recorded in the inserted recording medium being read from the inserted recording medium, the recording medium chamber being shielded with a wall having conductivity of electricity; and an image display unit comprising a display for displaying the image captured by the imaging device, the image display unit being shielded with a wall having conductivity of electricity; and wherein the first circuit board, the recording medium chamber, the second circuit board and the image display unit are arranged in that order and parallel to one another such that the recording medium chamber and the image display unit themselves serve as shields.

2. The electronic image recording apparatus as defined in claim 1, wherein the first circuit board, the recording medium chamber, the second circuit board and the image display unit are perpendicular to an optical axis of the taking lens.

3. The electronic image recording apparatus as defined in claim 1, further comprising:

a casing for containing the optical unit, the first circuit board, the second circuit board, the recording medium chamber and the image display unit, the casing having conductivity of electricity;

wherein the casing, the wall of the recording medium chamber and the wall of the image display unit are connected electricity-conductively to one another.

4. The electronic image recording apparatus as defined in claim 1, wherein a signal wire which transmits an analog image signal from the imaging device is perpendicular to the first circuit board, the recording medium chamber, the second circuit board, and the image display unit.

* * * * *